(12) United States Patent
Colgan et al.

(10) Patent No.: US 7,803,664 B2
(45) Date of Patent: Sep. 28, 2010

(54) APPARATUS AND METHODS FOR COOLING SEMICONDUCTOR INTEGRATED CIRCUIT PACKAGE STRUCTURES

(75) Inventors: Evan George Colgan, Chestnut Ridge, NY (US); Gary Goth, Pleasant Valley, NY (US); Deborah Anne Sylvester, Poughkeepsie, NY (US); Jeffrey Allen Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 12/115,332

(22) Filed: May 5, 2008

(65) Prior Publication Data

US 2008/0242002 A1 Oct. 2, 2008

Related U.S. Application Data

(62) Division of application No. 10/991,987, filed on Nov. 19, 2004, now Pat. No. 7,394,659.

(51) Int. Cl.
*H01L 21/00* (2006.01)
*H01L 23/34* (2006.01)
*H01L 23/367* (2006.01)

(52) U.S. Cl. .................. 438/122; 438/118; 257/712; 257/E23.104

(58) Field of Classification Search ................ 438/118, 438/121–122; 257/E23.08–E23.113, 708–722
See application file for complete search history.

(56) References Cited

U.S. PATENT DOCUMENTS

| 5,724,729 | A  | * | 3/1998  | Sherif et al. .................. 29/840 |
| 6,294,408 | B1 | * | 9/2001  | Edwards et al. ............. 438/121 |
| 6,462,410 | B1 | * | 10/2002 | Novotny et al. ............. 257/707 |
| 2004/0190254 | A1 | * | 9/2004  | Hu et al. ..................... 361/699 |
| 2004/0262766 | A1 | * | 12/2004 | Houle ........................ 257/758 |
| 2005/0068725 | A1 | * | 3/2005  | Houle et al. ................ 361/688 |

\* cited by examiner

*Primary Examiner*—Savitri Mulpuri
*Assistant Examiner*—Calvin Choi (57) ABSTRACT

The present invention relates generally to apparatus and methods for cooling semiconductor integrated circuit (IC) chip package structures. More specifically, the present invention relates to apparatus and methods for thermally coupling semiconductor chips to a heat conducting device (e.g., copper thermal hat or lid) using a compliant thermally conductive material (e.g., thermal paste), wherein a thermal interface is designed to prevent/inhibit the formation of voids in the compliant thermally conductive material due to the flow of such material in and out from between the chips and the heat conducting device due to thermal cycling.

13 Claims, 7 Drawing Sheets

APPARATUS AND METHODS FOR COOLING SEMICONDUCTOR INTEGRATED CIRCUIT PACKAGE STRUCTURES

CROSS-REFERENCE TO RELATED APPLICATION

This is a Divisional Application of U.S. patent application Ser. No. 10/991,987, filed Nov. 19, 2004 now U.S. Pat. No. 7,394,659, the disclosures of which are herein incorporated by reference in their entirety.

TECHNICAL FIELD OF THE INVENTION

The present invention relates generally to apparatus and methods for cooling semiconductor integrated circuit (IC) chip package structures. More specifically, the present invention relates to apparatus and methods for thermally interfacing semiconductor chips to a heat conducting device (e.g., thermal hat) using a compliant thermally conductive material (e.g., thermal paste), wherein the thermal interface is designed to prevent the formation of voids in the compliant thermally conductive material.

BACKGROUND

In the design and manufacture of semiconductor IC (integrated circuit) chip packages and modules (e.g., SCM (single chip modules) or MCMs (multi-chip modules)), it is imperative to implement mechanisms that can effectively remove heat generated by IC chip devices (such as microprocessors) to ensure continued reliable operation of the devices. Effective heat removal becomes increasingly problematic as chip geometries are scaled down and operating speeds are increased, which results in increased power density. Although improved IC chip module designs are being developed to operate at higher clock frequencies, increased system performance is limited primarily by the ability to implement effective heat removal mechanisms to cool the IC chip modules.

Various heat removal techniques have been developed for cooling semiconductor packages. For example, one technique that is typically employed includes thermally coupling a thermal hat or package cap/lid/cover to one or more semiconductor IC chips using a compliant thermally conductive material (e.g., thermally conductive paste) as a thermal interface, and then thermally coupling the thermal hat or package lid to a cooling plate or heat sink. The package lid or thermal hat, which can be formed of a high thermal conductivity material, such as copper or aluminum, will conduct heat away from the IC chip(s) and the heat is removed from the cooling plate or heat sink by methods such as forced air cooling or circulating liquid coolants.

A compliant thermally conductive material (or TIM (thermal interface material)) is typically used (as opposed to a rigid bond) to thermally couple an IC chip to a thermal hat when, for example, the difference in thermal expansion between the material of the IC chip and the material of the thermal hat is relatively large. For example, there is a significant difference between the thermal expansion of a thermal hat made of copper (Cu) which has a thermal coefficient of expansion (TCE) of about 16.5 ppm/° C., and a silicon (Si) chip which has a TCE of about 2.5 ppm/° C. The use of a compliant thermally conductive material layer between a Cu thermal hat and a Si IC chip reduces stress at the thermal interface due to differences in thermal expansion of the IC chip and the thermal hat.

Moreover, effective cooling techniques are even more problematic for, e.g., a multi-chip module (MCM), wherein an array of chips mounted on a common substrate are thermally coupled to a common thermal hat or package lid, for example, using a compliant thermally conductive material. Indeed, differences in thermal expansion between the materials that form the package substrate, the chips, and the thermal hat, for example, can result in both vertical and horizontal deflections during power or temperature cycling. These deflections can lead to the migration of the compliant thermally conductive material out of the gap between the IC chips and the thermal hat, resulting in voids that increase the thermal resistance between the IC chip and the thermal hat and causing local increases in the operating temperature of the IC chips.

More specifically, when the TIM layers are compressed (due to thermal expansion of the chips and the thermal hat), by conservation of volume, some compliant material is squeezed out from between the chips and the thermal hat at the edges of the chips. When the pressure is relaxed, if the thermally conductive compliant material has not flowed too far past the edges of the chips, the compliant material will flow back into the gap between the chip and the thermal hat. If the compression force has caused the thermally conductive compliant material to flow beyond a certain critical distance beyond the gap between the chip and the thermal hat, air will flow back into the gap instead of the thermally conductive compliant material, thereby forming a void. As noted above, such voids can cause a significant increase in the chip operating temperatures in the regions of the chip in contact with the voids.

Furthermore, difficulties arise for efficient heat removal with respect to IC chips, such as processors, that have "hot spot" regions, which can have a heat flux significantly greater than the average heat flux, resulting in temperatures significantly hotter than the average chip temperature. A thermal solution that may be adequate for efficiently removing heat from a region of a chip having an average chip power density may not be adequate for removing heat from a "hot spot" region of the chip, i.e., a region having an above average chip power density, which can result in failure of the chip devices within or near the "hot spot" region.

SUMMARY OF THE INVENTION

Exemplary embodiments described herein generally include apparatus and methods for cooling semiconductor integrated circuit (IC) chip package structures, such as MCM (multi-chip modules). More specifically, exemplary embodiments of the invention include apparatus and methods for thermally coupling the non-active (back) surface of semiconductor chips to a heat conducting device (e.g., copper thermal hat or lid) using a compliant thermally conductive material (e.g., thermal paste), wherein a thermal interface is designed to maintain the reliability of the thermally conductive compliant material by preventing/inhibiting the formation of voids in the compliant thermally conductive material as a result of power/thermal cycling which occurs under normal operation conditions of the chip package.

In particular, in one exemplary embodiment, an chip package apparatus includes an IC chip having a non-active surface, a heat conducting device having a thermal contact surface, wherein the thermal contact surface comprises one or more channels formed therein, and a TIM (thermal interface material) layer formed between, and thermally coupling, the non-active surface of the IC chip and the thermal contact surface of the heat conducting device, the TIM layer comprising a compliant thermally conductive material, wherein the one or more channels formed in the thermal contact surface are not filled with complaint thermally conductive material. The non-filled channels enable increased retention of the TIM material between the chips and the heat conducting device (e.g., thermal hat or package covers) and prevent the formation of voids in the TIM material due to thermally/mechanically induced gap changes between the chips and thermal contact surface of the heat conducting device.

In other exemplary embodiments of the inventions, methods are provided for assembling chip packages using heat conducting devices with channels formed in thermal contact surface regions thereof, in a manner that prevents the channels from being filled with compliant thermal conductive material of the TIM layers during assembly of the chip package.

In other exemplary embodiments of the invention, channels are formed in thermal contact surface regions of a heat conducting device such that when the chips are aligned to corresponding thermal contact surface regions, the channels do not overlap areas of higher than average power density (hot spot regions) on the chips, thereby minimizing any increase of the temperature of the chip "hot spots".

These and other exemplary embodiments, aspects, features, and advantages of the present invention will become apparent from the following detailed description of exemplary embodiments, which is to be read in connection with the accompanying drawings.

DETAILED DESCRIPTION OF EXEMPLARY EMBODIMENTS

Figure 1:
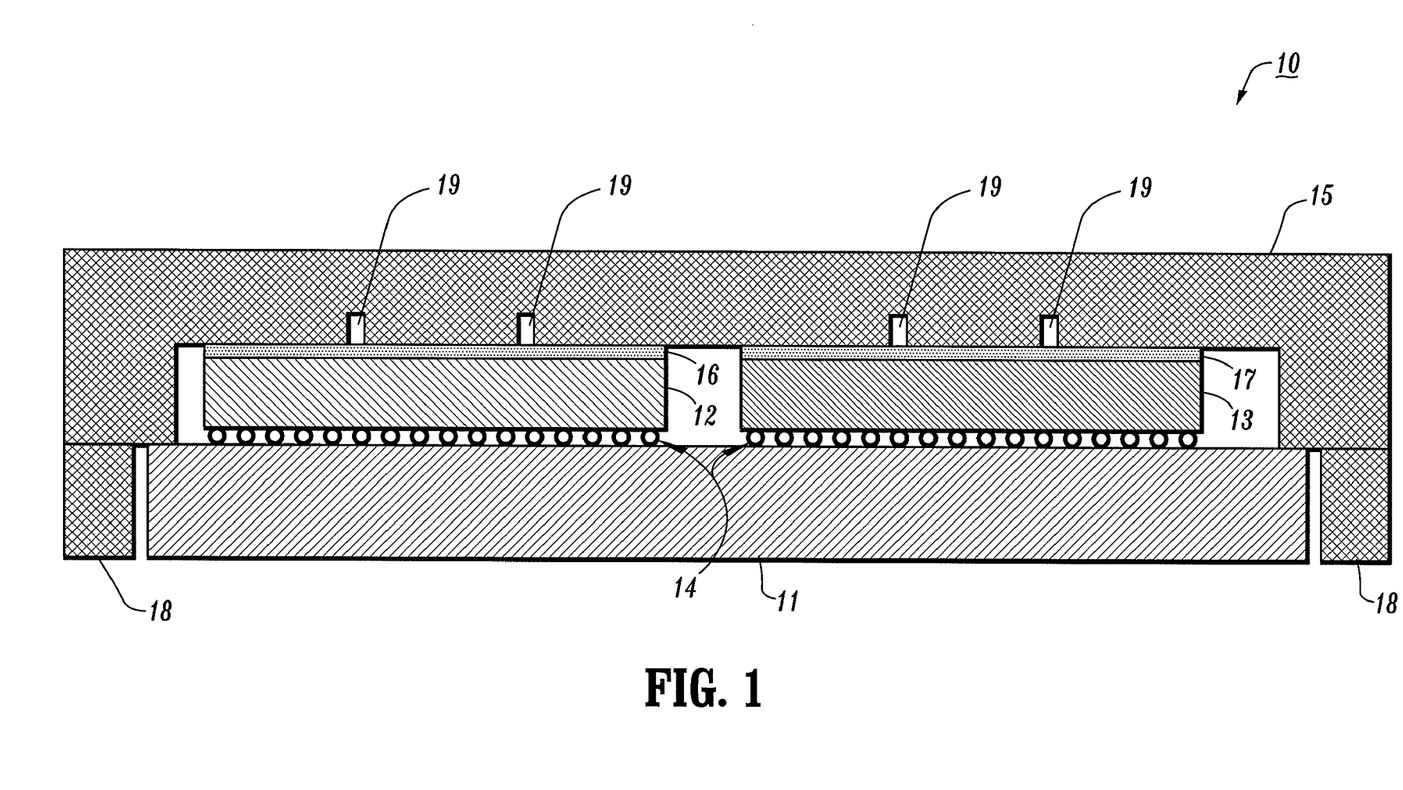
FIG. 1 schematically illustrates an MCM apparatus in which semiconductor chips are thermally coupled to a heat conducting device using compliant thermally conductive material, according to an exemplary embodiment of the invention.

FIG. 1 schematically illustrates, in general, an apparatus for thermally coupling semiconductor chips to a heat conducting device using compliant thermally conductive material, according to an exemplary embodiment of the invention. In particular, FIG. 1 is a schematic cross-sectional side view of an apparatus (10) (or MCM package) for thermally coupling the back (non-active) surface of semiconductor chips (12) and (13) to a heat conducting device (15) (e.g., package lid, thermal hat, etc.) using compliant thermally conductive material layers (16) and (17) (or TIM (thermal interface material) layers) formed of, e.g., thermal paste. The heat conducting device (15) is rigidly positioned in relation to the back surfaces of the chips (12) and (13). The TIM layers (16) and (17) provide mechanical compliance, as well as a heat conducting path, between the chips (12) and (13) and the heat conducting device (15).

As explained in further detail below, the apparatus (10) is designed to maintain the reliability of the TIM layers (16) and (17) by preventing the formation of voids in the TIM layers (16) and (17) during power and/or thermal cycling. In particular, the heat conducting device (15) includes a plurality of thermal contact surface regions (or thermal contact surfaces) that are aligned, and in thermal contact, with the non-active surfaces of the chips (12) and (13). Each thermal contact surface includes a plurality of non-filled channels (19) (or grooves) formed in the thermal contact surface regions of the heat conducting device (15), which are not filled with compliant thermally conductive material forming the TIM layers (16) and (17). The package structure (10) is assembled using one of various exemplary methods of the invention (as described below) to prevent the channels (19) from being filled with thermal conductive compliant material during assembly.

The non-filled channels (19) effectively prevent/inhibit the formation of voids in the TIM layers (16) and (17). More specifically, as explained in further detail below, since the heat conducting device (15) is rigidly positioned with respect to the non-active surfaces of the chips (12) and (13), the non-filled channels (19) effectively minimize the extent to which compliant thermally conductive material of the TIM layers (16) and (17) will flow in and out from the space between the chips (12) and (13) and corresponding thermal contact surface regions of the heat conducting device (15) at the outer perimeter of the chips (12) and (13), as a result of expansion and contraction of the rigidly positioned chips and heat conducting device (15) during power/thermal cycling.

Details regarding various exemplary embodiments of chip packages according to the invention having architectures similar to that depicted in FIG. 1 will now be discussed in further detail with reference to FIG. 1. In one exemplary embodiment of the mounted face-down (i.e., flip-chip bonded) on the substrate (11) using micro solder balls (14) such as C4's (i.e., the active surface of the chips face the carrier substrate (11)). The substrate (11) may be formed of a ceramic material or polymer material having a thermal coefficient of expansion close to that of silicon (Si) (or any other substrate material that forms the chips (12) and (13), such as GaAs, etc.). The substrate (11) comprises multiple layers of wiring which interconnect the chips (12) and (13) to each other and to contacts on the bottom surface of the substrate (11), which enable electrical connections to corresponding points on a printed circuit board (PCB).

As discussed above, the heat conducting device (15) comprises thermal contact surface regions that are thermally coupled to the non-active surfaces of corresponding semiconductor chips (12) and (13) via respective TIM layers (16) and (17). In the exemplary apparatus (10) of FIG. 1, the structures in contact with the TIM layers (16) and (17) are rigidly fixed with respect to each other. More specifically, a base ring (18) surrounds the substrate (11) and the base ring (18) provides a means to mount the substrate (11) containing the chips to the PCB and to the heat conducting device (15). The substrate (11) is fixedly attached to the base ring (18) and the heat conducting device (15) is bonded to the substrate (11) using an adhesive, or other means, around the perimeter of the substrate (11) in such a way as to form a hermetically, or nearly hermetically, sealed region to protect the chips (12) and (13) from exposure to moisture and the ambient.

It is to be noted that the heat conducting device (15) may be any thermally conductive device that can be coupled to a semiconductor chip to dissipate heat that is generated by the semiconductor chip. For example, the heat conducting device (15) may be any one of known devices generally referred to as thermal hats, thermal caps, package lids/caps/covers, heat spreaders, etc., which are used for constructing chip packages. The heat conducting device (15) may be formed of, e.g., ceramic or a material with a high thermal conductivity, such as copper (Cu) or aluminum (Al), having different coefficients of thermal expansion as that of the chip material (e.g., silicon). In one exemplary embodiment, the heat conducting device (15) acts as a thermal spreader which conducts the heat generated by the chips (12) and (13) to either an air cooled finned heat sink mounted on the top surface of the heat conducting device (15), or to a water cooled cold plate (e.g., mini, or micro, channel cooling module) mounted on the top surface of the heat conducting device (15). In another embodiment, the heat conducting device (15) can be designed with flow channels formed inside of the heat conducting device (15) for enabling the flow of coolant fluid through the heat conducting device (15), as is known in the art.

The TIM layers (16) and (17) between respective chips (12) and (13) and the heat conducting device (15) provide mechanical compliance and provide the primary cooling path from the chips (12) and (13) to the heat conducting device (15). Depending on the application, the TIM layers (16) and (17) may be formed using any suitable compliant thermally conductive material including, for example, thermal pastes, thermal greases, or thermally conductive fluids such as oils. Thermally conductive pastes typically comprise thermally conductive particles having a distribution of sizes dispersed within a binder material or matrix, such as the thermal pastes described in U.S. Pat. No. 5,098,609, entitled "Stable High Solids, High Thermal Conductivity Pastes", which is incorporated herein by reference. Typical TIMs include those having a wax matrix, commonly known as phase-change materials, those having a silicone-based matrix, and dry particle lubricants such as graphite and metal powders. Less viscous thermally conductive materials, such as oils, have a lower thermal conductivity than pastes, but can also be applied in much thinner layers, resulting in improved thermal performance, but less mechanical compliance.

Preferably, thermally conductive compliant materials, such as those described in the above incorporated U.S. Pat. No. 5,098,609 to Iruvanti, which provide high thermal conductivity, and high viscosity (where the fraction of the material which is composed of solids is very high), are used for forming the TIM layers (16) and (17). The thickness of the TIM layers (16) and (17) will vary depending on the application. For example, in one exemplary embodiment of the invention, the TIM layers (16) and (17) are formed to have a thickness in the range of about 2 to about 6 mils, and more preferably, in a range from about 3 to about 4 mils.

The package apparatus (10) can be electrically connected to a PCB with a land grid array (LGA) type of connection, wherein the combination of the substrate (11), base ring (18) and heat conducting device (15) are designed to allow a large compressive force to be applied to the LGA between the MCM package (10) and the PCB to insure reliable electrical contacts are formed. The combination of the heat conducting device (15) and the compliant TIM layers (16) and (17) are designed to prevent the LGA actuation force from damaging the C4 electrical connections (14) between the chips (12) and (13) and the substrate (11). The actuation of the LGA causes a slight mechanical compression of the TIM layers (16) and (17).

As noted above, the heat conducting device (15) comprises longitudinally extending channels (19) that are formed in thermal contact surface regions of the heat conducting device (15) adjacent the chips (12) and (13). The channels (19) are in contact with the TIM layers (16) and (17) on the back (non-active) surface of the chips (12) and (13). The package apparatus (10) is assembled such that the channels (19) are not filled with thermally conductive compliant material forming the TIM layers (16) and (17). Indeed, as explained below, the non-filled channels (19) provide a mechanism for reducing or eliminating the formation of voids in the TIM layers (16) and (17) as a result of thermal, power, or mechanical cycling.

One model for explaining how the empty channels (19) operate to reduce formation of voids is that the channels (19) increase the "edge" area in contact with the compliant material of TIM layers (16) and (17). In this regard, the channels (19) can be viewed as a mechanism for effectively dividing a single large chip into multiple smaller chips. In particular, when the TIM layers (16) and (17) are compressed due to thermal expansion of the chips (12) and (13) and the heat conducting device (15), by conservation of volume, the compliant material will be squeezed out from between the chips (12), (13) and the heat conducting device (15) at the edges of the chips (12) and (13). The non-filled channels (19) which contact the thermally conductive compliant material layer behind the chips, provide additional locations for the thermally conductive compliant material layer to flow. As such, the extent to which compliant thermally conductive material flows in and out from a given "edge" location is reduced, thereby reducing potential formation of voids in the thermally conductive compliant layer between the chip and the heat conductive device.

In accordance with exemplary embodiments of the invention, methods are provided for assembling IC chip packages using heat conducting devices with empty channels/slots/grooves formed in the surface of chip site regions thereof, such that the channels are not filled with compliant thermally conductive material during encapsulation. It is advantageous to form thick TIM layers with a large excess of material and then squeeze the TIM layers down to a desired thickness during the encapsulation process. The excess thermally conductive compliant material that flows out into the region around the chips effectively acts as a barrier and helps retain the thermally conductive compliant material in the gap between the chips and the heat conducting device during thermal, power, or mechanical cycling. However, if this method is applied for assembling a chip package having a heat conducting device with channels formed in surface regions thereof, the excess thermally conductive complaint material could be squeezed into such channels and possibly fill the channels, which is not desirable.

Accordingly, methods for constructing packages according to other exemplary embodiments of the invention are provided, which enable thick TIM layers to be formed on the surface of the chips, for example, while preventing the channels formed in the contact surface of the heat conducting device from being filled with excess compliant thermally conductive material that is squeezed out from between the chips and heat conducting device during the assembly process. In general, exemplary embodiments of the invention, as described below with reference to FIGS. 2-5 include methods for filling or covering the channels to keep them from being filled with the thermal conductive compliant material during the assembly process and then subsequently clearing, or uncovering, the channels.

Figure 2A:
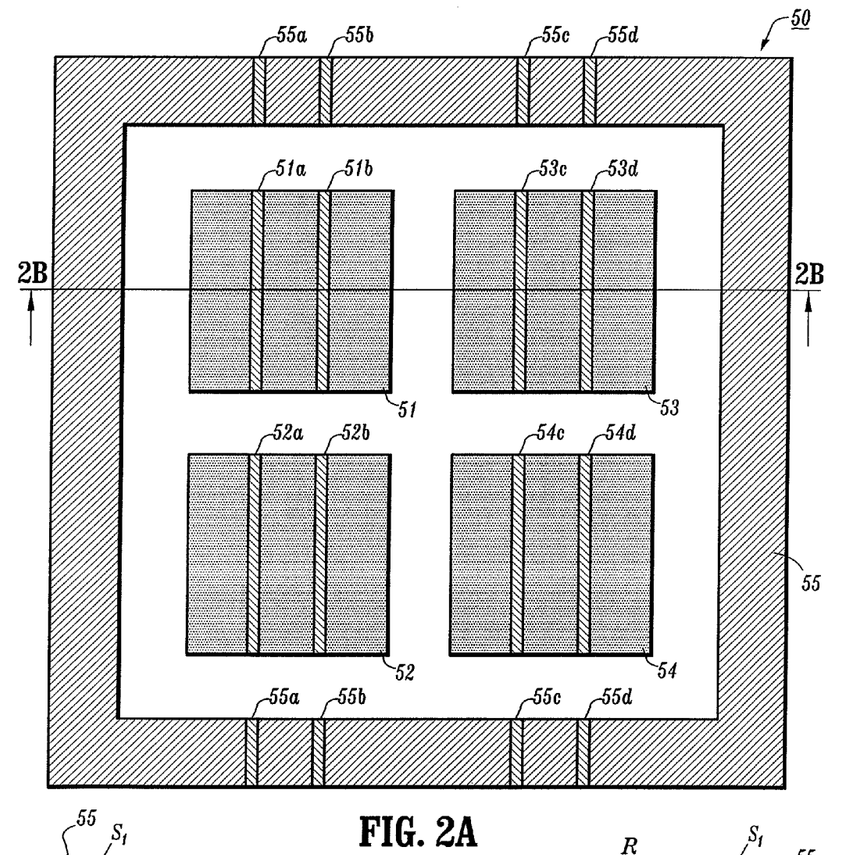
FIGS. 2A and 2B schematically illustrate a heat conducting device that enables use of rigid rods to form empty channels in chip site surfaces of the heat conducting device when assembling an MCM apparatus, according to an exemplary embodiment of the invention.
Figure 2B:
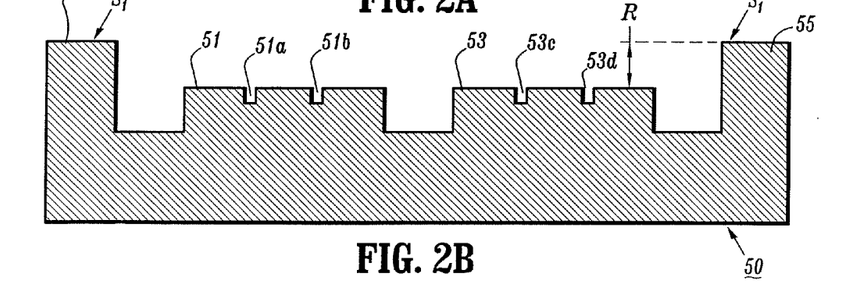

More specifically, FIGS. 2A and 2B schematically illustrate a heat conducting device (50) that enables use of rigid rods to form empty channels in chip site surfaces of the heat conducting device (50) when assembling an MCM apparatus, according to an exemplary embodiment of the invention. More specifically, FIG. 2A is a top plan view that schematically illustrates surface regions of the heat conducting device (50) which interface with chips and a package substrate, and FIG. 2B is a cross-sectional side view of the heat conducting device (50) taken along line 2B-2B in FIG. 2A. As depicted in FIGS. 2A and 2B, the exemplary heat conducting device (50) comprises a plurality of raised/projecting structures (51, 52, 53, 54) (or chip sites) each comprising a thermal contact surface, which are aligned with corresponding chips mounted on a package substrate. The heat conducting device (50) comprises a projecting outer portion (55) (or peripheral ledge) having a surface (S1) that is bonded to the package substrate using a sealant/adhesive. The distance (R) between the thermal contact surfaces of the chip sites (51, 52, 53, and 54) and the surface (S1) will vary depending on, e.g., the thickness of the chips, and the resulting thickness of the bonding material between the surface S1 and the substrate surface, and the desired thickness of the TIM layers between the chips and the thermal contact surfaces of the chip sites.

In the exemplary embodiment, the chip sites (51~54) each comprises a pair of parallel channels (51a, 51b), (52a, 52b), (53c, 53d) and (54c, 54d) formed in the thermal contact surfaces thereof, respectively. Moreover, corresponding channels (55a), (55b), (55c) and (55d) are formed in the outer projecting portion (55) of the heat conducting device (50), and are aligned with respective channels on the raised portions (51)~(54) to enable rigid rods to be inserted into the channels. In particular, channels (55a), (55b), (55c) and (55d) are formed through the outer peripheral ledge (55), which are aligned with respective channel pairs (51a, 52a), (51b, 52b), (53c, 54c) and (53d, 54d). The channels (55a), (55b), (55c) and (55d) that are formed in the outer peripheral ledge (55) of the heat conducting device (50) enable the removal of rigid rods that are inserted in the channels of the chip sites (51)~(54) to prevent thermally conductive compliant material from being squeezed into such channels during assembly.

More specifically, a method for assembling a MCM package according to an exemplary embodiment of the invention using the device (50), for example, begins by inserting a thin rigid rod (e.g., metallic rods) in each aligned set of channels, such that the rigid rods are long enough to extend past the edge of the thermal hat (50). Next, a large excess of a thermally conductive compliant material is dispensed onto the thermal contact surfaces of the chip sites (51)~(54), or onto the back surfaces of chips mounted on a package substrate, which align to the chip sites, and a bead of an adhesive sealant is dispensed on the surface (S1) of the outer projecting portion (55) around the perimeter of the thermal hat (50), or onto the corresponding region of the package substrate. The chips that are mounted on the package substrate are then aligned to the corresponding chip sites (51)~(54) of the heat conducting device (50) and then contacted with a compression force such that the resulting thickness of the adhesive sealant layer and TIM layers are at the desired thickness. In one exemplary embodiment, the adhesive layer is about 0.5 mils thick and the thermally conductive compliant material is about 3 to 4 mils thick.

After the sealant/adhesive is cured, the rigid rods are removed from the assembly by pulling out the rigid rods extending from the channels (55a, 55c, 55c, and 55d) formed in the outer peripheral ledge (55) of the heat conducting device (50) and additional sealant/adhesive is used to seal the openings in the outer peripheral ledge (55) of the heat conducting device (50). It may be desirable to slightly compress the assembly when dispensing the additional sealant/adhesive so that when pressure is released, the sealant/adhesive is pulled into the small openings. The additional sealant/adhesive is subsequently cured. In another exemplary embodiment, instead of placing a single continuous rigid rod in each channel (i.e. in channels (55a), (51a) and (52a), for example), two separate rigid rods could be used wherein, e.g., one rod is placed in channels (55a) and (51a) and another rod is placed in channels (52a) and (55a) such that there is a gap between the rods between the two chip sites (51) and (52), and wherein each rigid rod extends beyond opposite sides of the outer projecting portion (55).

Figure 3A:
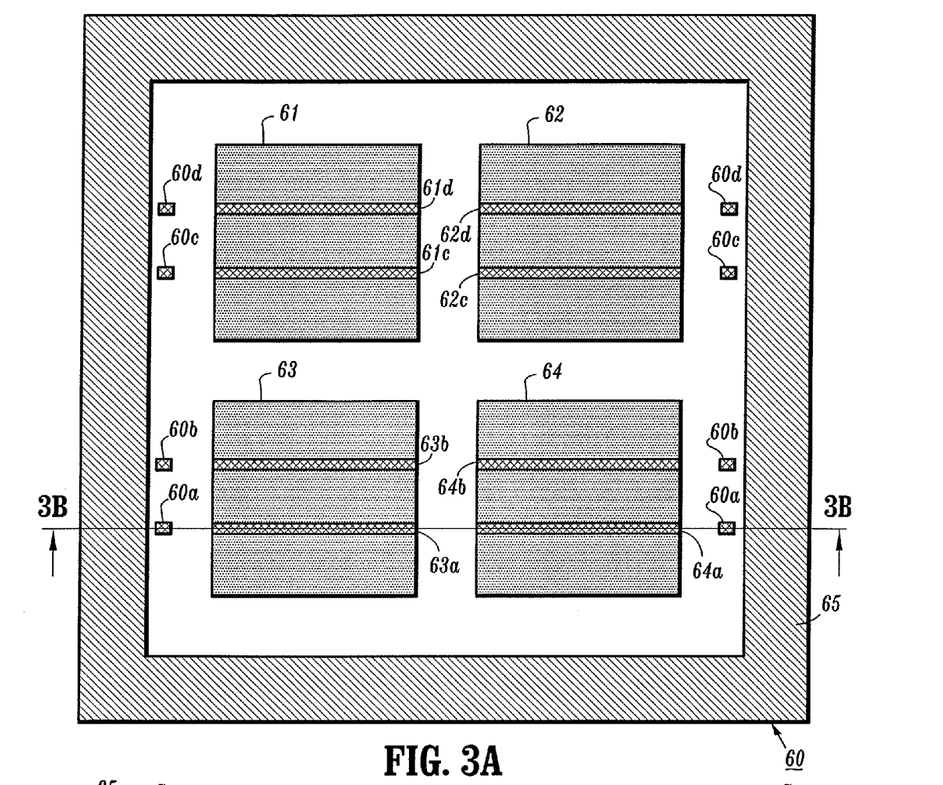
FIGS. 3A and 3B schematically illustrate a heat conducting device that enables use of flexible objects, such as strings or fibers, to form empty channels in chip site surfaces of the heat conducting device when assembling an MCM apparatus, according to an exemplary embodiment of the invention.
Figure 3B:
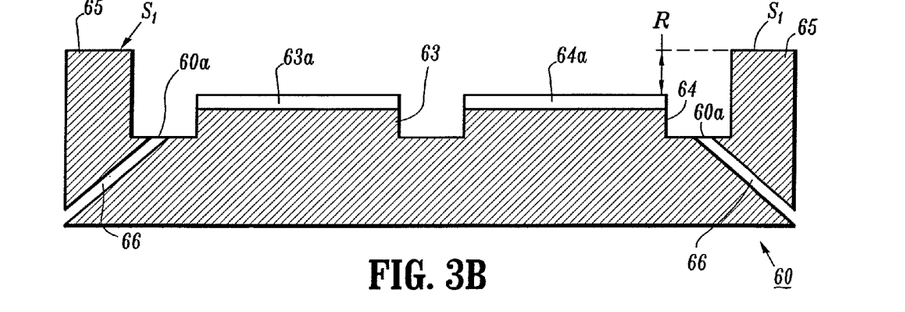

In another exemplary embodiment of the invention, a method for assembling a chip package uses a flexible object, such as a string or fiber (or similar object) to fill the channels to prevent excess thermal conductive compliant material from being squeezed into the channels during assembly, and to subsequently pull out the flexible string, fiber, etc. after the encapsulation process has been completed. For example, FIGS. 3A and 3B schematically illustrate a heat conducting device (60) that enables use of flexible objects, such as strings or fibers, to form empty channels in chip site surfaces of the heat conducting device (60) when assembling an MCM apparatus, according to an exemplary embodiment of the invention. More specifically, FIG. 3A is a top plan view that schematically illustrates surface regions of the heat conductive device (60) which interface with a package substrate and IC chips mounted on the substrate, and FIG. 3B is a cross-sectional side view of the heat conducting device (60) taken along line 3B-3B in FIG. 3A.

As depicted in FIGS. 3A and 3B, the exemplary heat conducting device (60) comprises a plurality of raised/projecting regions (61, 62, 63, 64) (or chip sites) each having a thermal contact surface, which are aligned with corresponding chips mounted on a package substrate. The heat conducting device (60) comprises a projecting outer portion (65) (or outer peripheral ledge) having a surface (S1) that is bonded to the package substrate using a sealant/adhesive. As noted above, the distance (R) between the thermal contact surfaces of the chip sites (61, 62, 63, and 64) and the surface S1 will vary depending on, e.g., the thickness of the chips, and the resulting thickness of the bonding material (between S1 and the substrate) and the desired thickness of the TIM layers between the chips and the thermal contact surface of the chip sites.

In the exemplary embodiment, the chip sites (61), (62), (63) and (64) each comprise a pair of parallel channels (61c, 61d), (62c, 62d), (63a, 63b) and (64a, 64b), respectively, formed in a thermal contact surface thereof. Moreover, corresponding openings (60a), (60b), (60c) and (60d) are formed in recessed regions of the heat conducting device (60) between the chip sites and the outer peripheral ledge (65). As shown in FIG. 3B, the openings (60a) lead to holes (66) that are formed to penetrate through the heat conducting device (60). The openings (60a), (60b), (60c) and (60d) are aligned with respective channels in the thermal contact surface of the chip sites (61)~(64) to enable flexible objects (such as string) to be inserted into the channels and through respective openings/holes (60a, 60b, 60c, 60d, 66).

In particular, by way of example, channels (63a) and (64a) are aligned with openings (60a) to enable a string to be inserted before an encapsulation process to prevent thermally conductive compliant material from being squeezed into the channels of the raised portions. A method for assembling a package structure using the exemplary heat conducting device (60) is similar to that discussed above, and the holes (66) which penetrate through the heat conducting device (60) are subsequently sealed with additional sealant/adhesive after the strings are pulled out.

In another exemplary embodiment, instead of placing a single continuous string in each channel (e.g., in channels (63a) and (64a) and through holes (60a) and (66)), for example), two separate strings could be used wherein, e.g., one string is placed in channel (63a) and another string is placed in channel (64a) such that there is a gap between the string between the two chip sites (63) and (64), and wherein the separate string pieces extend from the through channels (66) beyond opposite sides of the outer projecting portion (65).

Figure 4A:
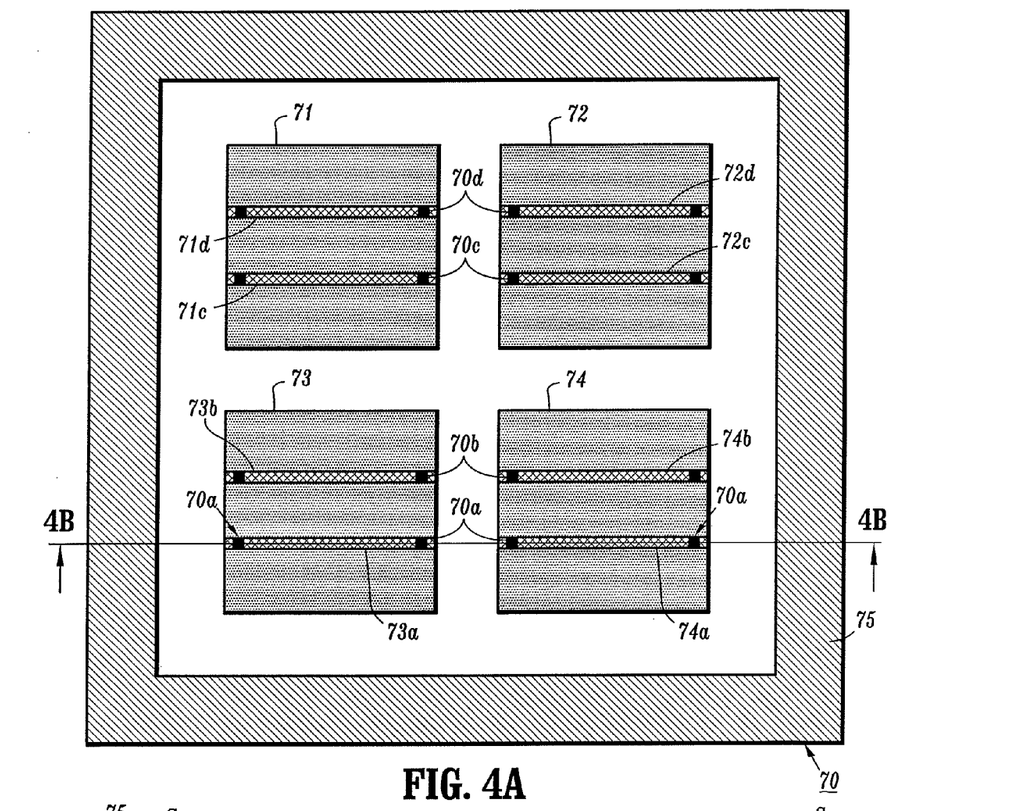
FIGS. 4A and 4B schematically illustrate a heat conducting device that enables use of meltable or dissolvable material to form empty channels in chip site surfaces of the heat conducting device when assembling an MCM apparatus, according to an exemplary embodiment of the invention.
Figure 4B:
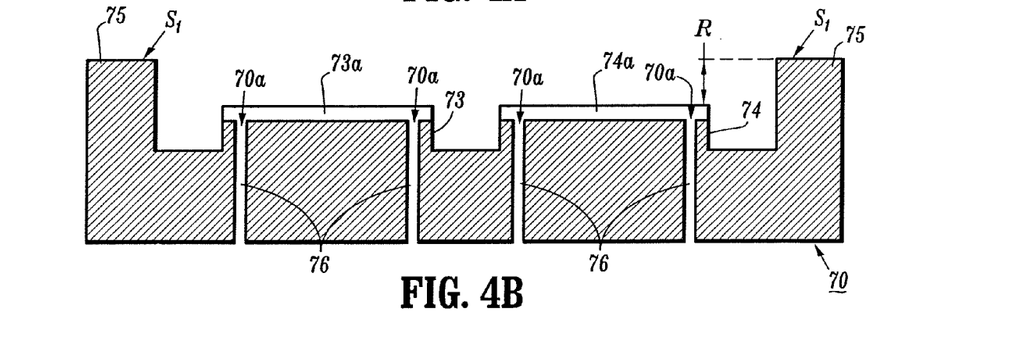

In yet another exemplary embodiment of the invention, a method for assembling a chip package uses a meltable or dissolvable material to fill the channels formed in thermal contact surface regions of a heat conducting device, to prevent excess thermal conductive compliant material from being squeezed into the channels during encapsulation, and to subsequently melt or otherwise dissolve the material and remove the melted/dissolved material after assembly. For example, FIGS. 4A and 4B schematically illustrate a heat conducting device (70) that enables use of meltable or dissolvable material to form empty channels in chip site surfaces of the heat conducting device (70) when assembling an MCM apparatus, according to an exemplary embodiment of the invention. More specifically, FIG. 4A is a top plan view that schematically illustrates surface regions of the heat conductive device (70) which interface with a package substrate and IC chips mounted on the package substrate, and FIG. 4B is a cross-sectional side view of the heat conducting device (70) taken along line 4B-4B in FIG. 4A.

As depicted in FIGS. 4A and 4B, the exemplary heat conducting device (70) comprises a plurality of raised/projecting regions (71, 72, 73, 74) (or chip sites) each having a thermal contact surface, which are aligned with corresponding chips mounted on the package substrate. The heat conducting device (70) comprises a projecting outer portion (75) (or outer peripheral ledge) having a surface (S1) that is bonded to the package substrate using a sealant/adhesive.

In the exemplary embodiment, the chip sites (71), (72), (73) and (74) each comprise a pair of parallel channels (71c, 71d), (72c, 72d), (73a, 73b) and (74a, 74b), respectively, formed in the thermal contact surface thereof. Moreover, corresponding openings (70a), (70b), (70c) and (70d) are formed near end portions of the channels, which lead to holes (76) (FIG. 4B) that are formed to penetrate through the heat conducting device (70). The openings (70a), (70b), (70c) and (70d) are aligned with respective channels in the thermal contact surfaces of the chip sites (71)~(74) to enable removal of melted or dissolved material from the channels after assembly through respective openings/holes (70a, 70b, 70c, 70d, 76).

More specifically, in one exemplary embodiment, the channels can be filled (or the top portion of the channels can be filled) with a wax or other material which melts at an elevated temperature, but below a temperature at which the thermally conductive compliant material flows, or which damages the sealant/adhesive. The thermally conductive compliant material is compressed between the back surface of the chips on the package substrate and the thermal contact surface regions of the heat conducting device at room temperature. The sealant/adhesive seal is cured at an elevated temperature of between 110~150 degrees C., which does not affect the TIM layers, but which enables the wax to melt and flow out of the channels and out of the heat conducting device via the channels (76) during the sealant/adhesive cure process. Thereafter, the openings/channels (76) in the heat conducting device (70) are sealed.

In another exemplary embodiment, the channels can be filled or covered with a dissolvable material (e.g., a polymer or plastic), which could be dissolved using a solvent but which would not dissolve or otherwise damage the TIM layer. In the exemplary embodiment depicted in FIGS. 4A and 4B, the use of two holes/openings for each channel is advantageous as a solvent could be forced into one opening to dissolve the material in the channels and then flow out from the second opening.

Figure 5A:
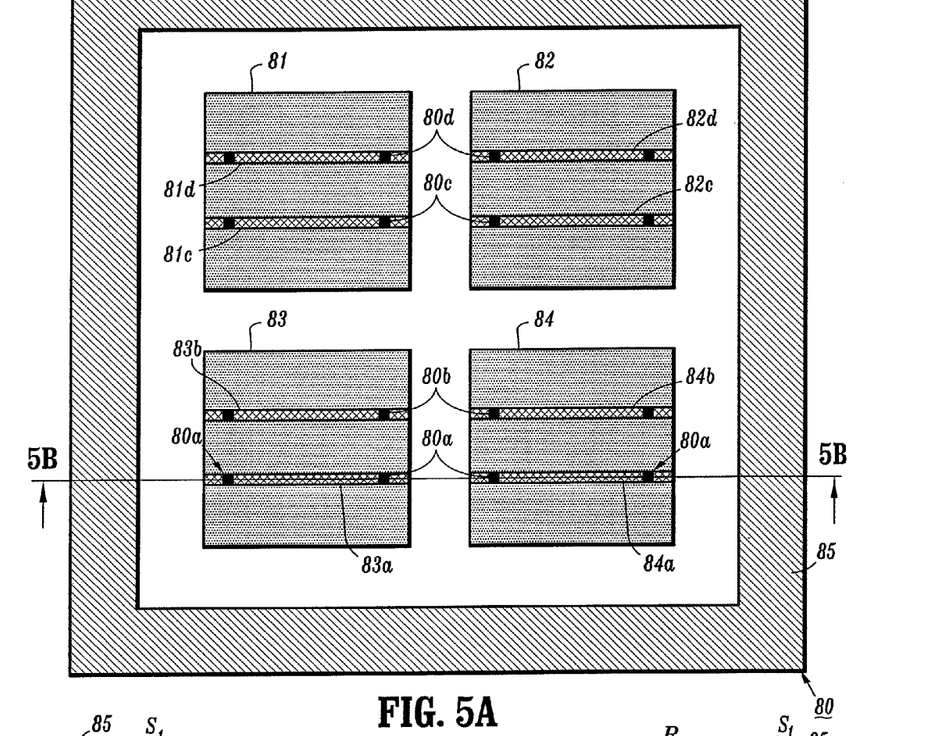
FIGS. 5A and 5B schematically illustrate a heat conducting device that enables use of meltable material to form empty channels in chip site surfaces of the heat conducting device when assembling an MCM apparatus, according to an exemplary embodiment of the invention.
Figure 5B:
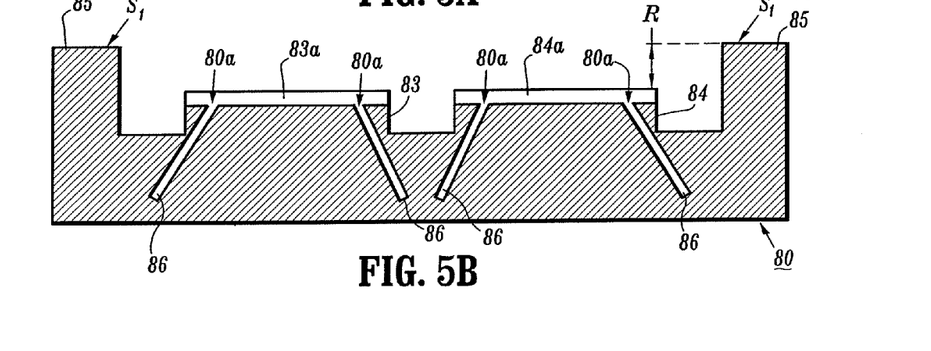

FIGS. 5A and 5B schematically illustrate a heat conducting device (80) that enables use of meltable material to form empty channels in chip site surfaces of the heat conducting device (80) when assembling an MCM apparatus, according to an exemplary embodiment of the invention. More specifically, FIG. 5A is a top plan view that schematically illustrates surface regions of the heat conductive device (80) which interface with a package substrate and IC chips mounted on the package substrate, and FIG. 5B is a cross-sectional side view of the heat conducting device (80) taken along line 5B-5B in FIG. 5A. The exemplary embodiment of FIGS. 5A~5B is similar to that of FIGS. 4A~4B, except that the melted material flows from the channels on chip sites to a compartments/channels (86) formed in the heat conducting device (80).

More specifically, as depicted in FIGS. 5A and 5B, the exemplary heat conducting device (80) comprises a plurality of raised/projecting regions (81, 82, 83, 84) (or chip sites) each having a thermal contact surface, which are aligned with corresponding chips mounted on a package substrate. The heat conducting device (80) comprises a projecting outer portion (85) (or outer peripheral ledge) having a surface (S1) that is bonded to the package substrate using a sealant/adhesive.

In the exemplary embodiment, the chip sites (81), (82), (83) and (84) each comprise a pair of parallel channels (81c, 81d), (82c, 82d), (83a, 83b) and (84a, 84b), respectively, formed in the thermal contact surface thereof. Moreover, corresponding openings (80a), (80b), (80c) and (80d) are formed near end portions of the channels, which lead to slanted channels (86) (FIG. 5B) that are formed within regions of the heat conducting device (80). The openings (80a), (80b), (80c) and (80d) to respective slanted channels (86) are aligned with respective channels in the thermal contact surfaces of the chip sites (81)~(84).

In one exemplary embodiment, the channels formed in the chip site thermal contact surfaces can be filled or covered with a meltable material, such as wax, which melts at an elevated temperature, but below a temperature at which the thermally conductive compliant material flows, or which damages the sealant/adhesive. More specifically, after assembly of a chip package, during a cure process of the sealant/adhesive, meltable material in (or covering) the channels in the thermal contact surfaces of the chip sites can be melted, such that the melted material flows into the angled compartments/channels (86) formed in the thermal hat and the air which was trapped in these holes flows back up into the slots.

Experiments were performed to determine the effectiveness of using non-filled channels formed in the thermal contact surface regions of a heat conducting device to reduce formation of voids in TIM layers. More specifically, test devices were built having a 3 mil thick thermally conductive compliant material located between a glass component (which was machined to have the same dimensions as an MCM substrate having chips about 20×20 mm in size mounted thereon) and a copper thermal hat. The copper thermal hat was designed to have four "chip sites" each 22.6×22.6 in size, wherein the thermal contact surface regions of a first chip site had a pair of horizontal channels spaced 7.6 mm apart and centered on the chip site, formed therein and wherein no channels were formed in the thermal contact surface region of a second chip site. The thermal contact surface of a third chip site had a single centered vertical channel formed therein, and the thermal contact surface of the fourth chip site had a pair of horizontal channels spaced 7.6 mm apart and centered on the chip site in combination with a single centered vertical channel formed therein. In all cases, each slot was 1/32" (~0.8 mm) wide and 0.036" (~0.9 mm) deep. Moreover, the copper surface in contact with the thermally conductive compliant material was grit blasted using methods described in U.S. Pat. No. 5,825,087, issued Oct. 20, 1998 to Iruvanti et al., entitled "Integral Mesh Flat Plate Cooling Module", which is commonly assigned and incorporated herein by reference.

An assembly process was then performed similar to that discussed above with reference to FIGS. 2A~2B. In particular, in the assembly process, thin metal rods were inserted in the channels formed in the thermal contact surface regions of the chip sites, which rods extended beyond the edge of the thermal hat. A large excess of the thermally conductive compliant material was dispensed onto each chip site of the thermal hat and a bead of an adhesive sealant was dispensed around the perimeter of the thermal hat except near where the thin metal rods exited. The glass component was than aligned to the thermal hat and compressed so that the thickness of the adhesive sealant layer was about 0.5 mils and the thermally conductive compliant material layers were about 3 mils thick. After curing the adhesive sealant, the thin metal rods were withdrawn and additional sealant was used to completely seal the structure. The additional sealant layer was than cured.

The test devices were subjected to thermal cycling from 10~110° C. for 250 and 500 cycles. For those chip sites having no channels formed in the thermal contact surface region, it was determined that extensive void formation occurred in the TIM layer between the thermal contact surface regions and the glass surface (emulating the chip surface) after thermal cycling. For those chip sites having a single centered vertical non-filled channel formed in the thermal contact surface region, the void formation which occurred in the TIM layer was only slightly less extensive than in the case having no channels after thermal cycling. In contrast, for chip sites where a pair of horizontal non-filled channels spaced 7.6 mm apart were used, it was found that only a very limited amount of void formation occurred in the TIM layer between the thermal contact surface regions and the glass surface (emulating the chip surface) after thermal cycling. For those chip sites having both a pair of horizontal non-filled channels spaced 7.6 mm apart and a centered vertical non-filled channel formed in the thermal contact surface region, there was somewhat more void formation in the TIM layer than with just a pair of horizontal non-filled channels, especially in the center region of the chip, after thermal cycling. Thus, the experimental results verify the effectiveness of using non-filled channels formed in thermal contact surface regions of a heat conducting device to reduce formation of voids in TIM layers, especially a horizontal pair spaced 7.6 mm apart. The results also suggest that having one channel, equivalent to a spacing of ~11 mm between the channel and the edges, is not very effective and also that intersecting channels (both horizontal and vertical), can result in additional void formation in the center region of the chip, so it is advantageous to avoid using intersecting channels.

In other exemplary embodiments of the invention, package structures are designed to provide sufficient cooling ability for chips having "hot spot" regions. In particular, in accordance with exemplary embodiments of the invention, to prevent an increase in the thermal resistance at specific areas of the chips where there are greater than average power densities ("hot spots"), the non-filled channels/slots that are formed in the thermal hat or package lid, for example, are positioned such that such channels/slots are not aligned with, or do not overlap, hot spot regions of the chips. Indeed, since the presence of empty channels/slots will result in a local increase in the thermal resistance, such channels/slots are preferably positioned away from (not aligned with) "hot spot" regions of the chips.

Figure 6A:
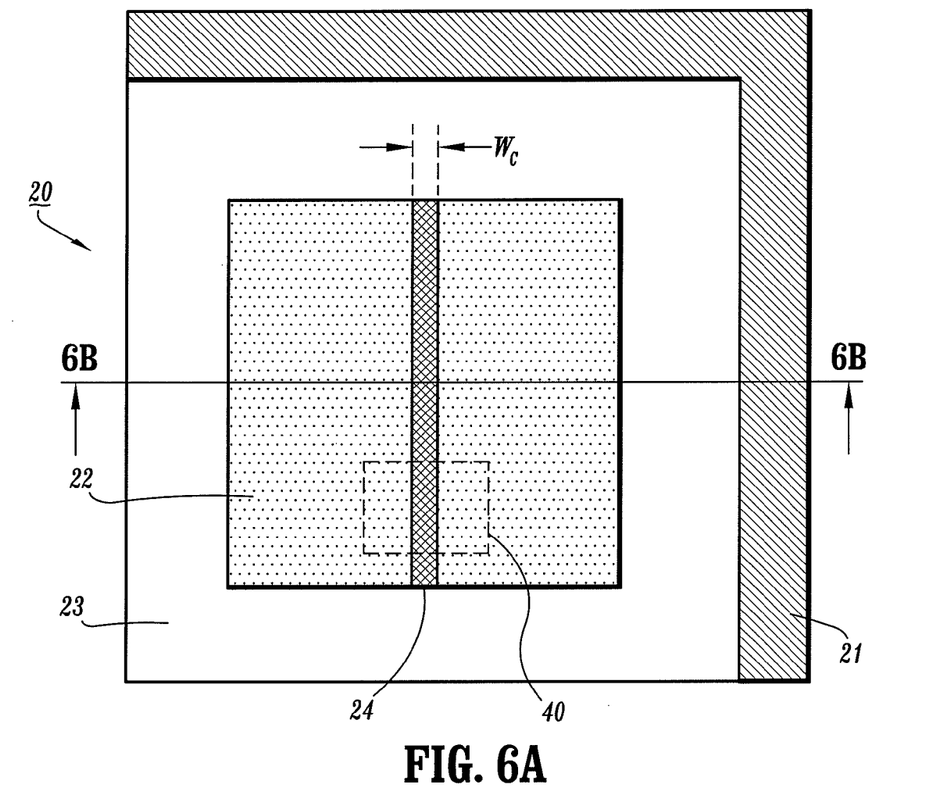
FIGS. 6A and 6B schematically illustrate a heat conducting device that was used in computer thermal simulations to determine the effects of having chip sites with empty channels aligned to chip "hot spot" regions.
Figure 6B:
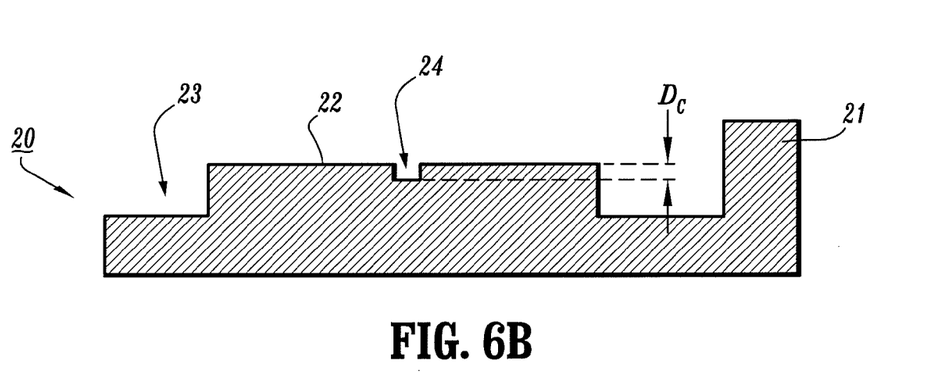
Figure 7A:
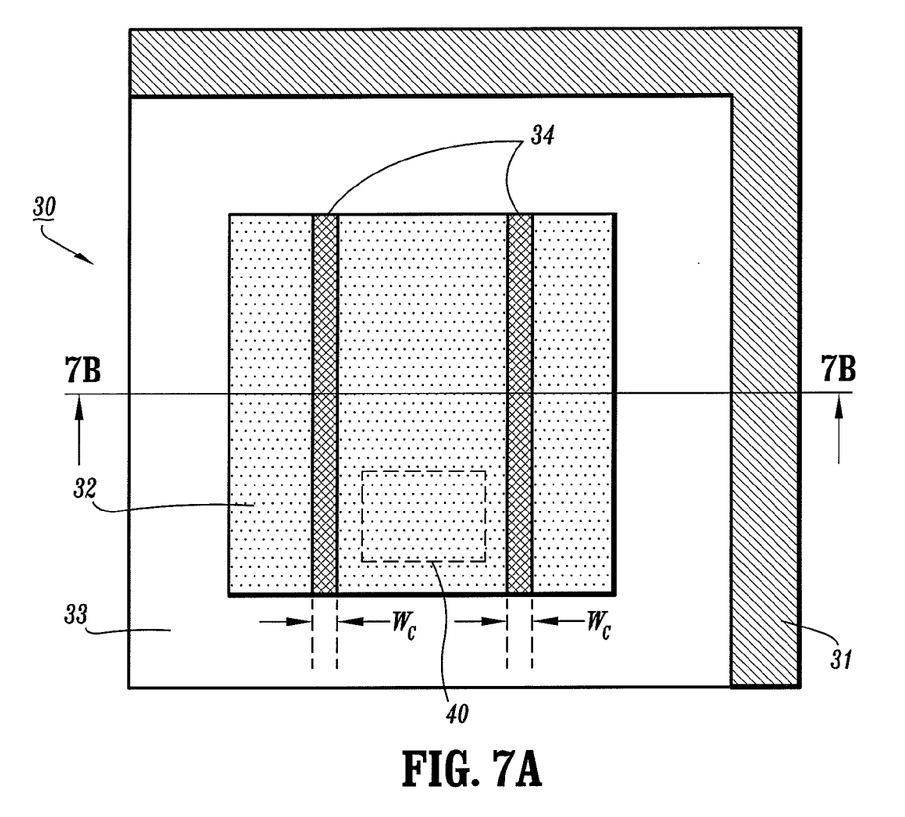
FIGS. 7A and 7B schematically illustrate a heat conducting device that was used in computer simulations to determine the effects of having chip sites with empty channels not aligned to chip "hot spot" regions.
Figure 7B:
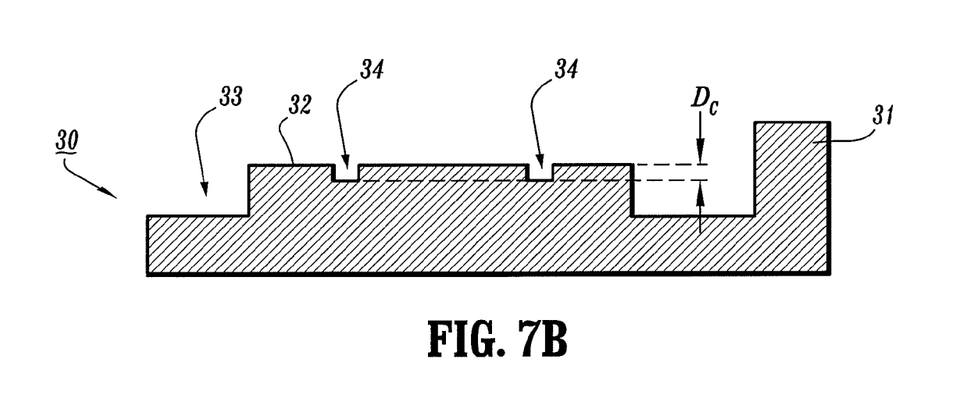

In other exemplary embodiments, the width of the channels that are formed in the thermal contact surface regions of the heat conducting device are minimized to limit the increase in thermal resistance caused by the existence of the non-filled channels, while maintaining the ability to adequately retain the TIM material to avoid formation of voids in the TIM layers during thermal/power/mechanical cycling. For example, in one embodiment of the invention, the slots/channels in a thermal contact surface region are formed to have a width that is approximately equal to, or less than, the thickness of the corresponding chip, as the chip itself acts as a thermal spreader. The thermal resistance of the air-filled slots/channels is far higher than that of the TIM material, silicon, or heat conducting device, so the heat generated by active devices on the surface of the chip aligned with the slots will need to be conducted around the air filled slots/channels. If the slots are wide relative to the thickness of the chip, the distance which the heat must move laterally through the chip is large and the thermal resistance can be increased substantially for active devices aligned with the slots. But if the width of the slots are approximately equal to, or less than, the thickness of the chip, the increase in the thermal resistance is smaller for active devices aligned with the slots. It is to be noted that with the experimental results described above wherein a reduction in void formation was obtained, the slot widths were about 0.8 mm, which is comparable to the thickness of silicon chips fabricated from an 200 mm diameter wafer, about 0.725 mm. In other experiments, the effects of the positioning of air-filled slots/channels were examined through a series of computer thermal simulations using exemplary thermal hat structures as illustrated in FIGS. 6A~6B and 7A~7B. FIGS. 6A and 6B schematically illustrate a heat conducting device (20) that was used in computer thermal simulations to determine the effects of having chip sites with empty channels aligned to chip "hot spot" regions. FIGS. 7A and 7B schematically illustrate a heat conducting device (30)

that was used in computer simulations to determine the effects of having chip sites with empty channels not aligned to chip "hot spot" regions.

More specifically, FIGS. 6A and 6B schematically illustrate a portion (e.g., one quadrant) of an MCM thermal hat (20) structure, wherein FIG. 6A schematically illustrates a top plan view of a quadrant of the thermal hat (20) and FIG. 6B schematically illustrates a cross-sectional side view of the portion of the thermal hat (20) taken along line 6B-6B in FIG. 6A. FIGS. 6A and 6B illustrate a portion (quadrant) of the thermal hat (20) comprising a projecting outer portion (21) (or outer peripheral ledge), a raised/projecting region (22) (chip site) formed in a recessed region (23). The chip site (22) comprises a single longitudinal channel (24) formed in a center region of the surface of the chip site (22), and having a channel width ($W_C$) and depth ($D_C$). A region (40) corresponds to a "hot spot" region of a chip which interfaces to the chip site (22) with a TIM material layer. In other words, in the exemplary embodiment of FIGS. 6A and 6B, it is assumed that the channel (24) is aligned to the hot spot region (40) of the chip.

Furthermore, FIGS. 7A and 7B schematically illustrate a portion (e.g., one quadrant) of an MCM thermal hat (30) structure, wherein FIG. 7A schematically illustrates a top plan view of a quadrant of the thermal hat (30) and FIG. 7B schematically illustrates a cross-sectional side view of the portion of the thermal hat (30) taken along line 7B-7B in FIG. 7A. FIGS. 7A and 7B illustrate a portion (quadrant) of the thermal hat (30) comprising a projecting outer portion (31) (or outer peripheral ledge), a raised/projecting region (32) (chip site) formed in a recessed region (33). The chip site (32) comprises two longitudinal channels (34) formed in the surface of the chip site (32), each having a channel width ($W_C$) and depth ($D_C$).

As in FIG. 6A, the region (40) denoted by the dotted line corresponds to a "hot spot" region of a chip which interfaces to the chip site (32) with a TIM material layer. However, in the exemplary embodiment of FIGS. 7A and 7B, the hot spot region (40) of the chip is located between the channels (34) (i.e., the channels (34) are not aligned with the hot spot region (40) of the chip).

For the computer simulations using the exemplary structures depicted in FIGS. 6A~6B and 7A~7B, it was assumed that the overall size of the recessed regions (23) and (33) along with the projecting outer portions (21) and (31) in each quadrant were 35 mm×35 mm, and the size of the chip sites (22) and (32) were 20 mm×20 mm. It was further assumed that the chip dimensions were 20 mm×20 mm (same as the chip sites (22) and (32)) with a chip thickness of 0.725 mm. Moreover, the chip was assumed to have an average power density of 100 W/cm$^2$, with the "hot spot" region (40) having a size of 4 mm×6 mm, which started 2 mm in from the edge of the chip and was centered in the other direction, with a power density of 250 W/cm$^2$. In addition, the TIM layers between the back surface of the chips and the thermal contact surface of the chip sites (22) and (32) were assumed to have a thickness of 4 mils, and to have a thermal conductivity of 4 W/cm-K. The thermal hats (20) and (30) were assumed to be formed of copper having a thickness of 6 mm at the chip sites (22) and (32), and that the thermal hats (20) and (30) were each coupled to a heat sink with a thermal resistance of 0.02 C-mm$^2$/W to ambient.

For a first set of computer simulations performed using the above described geometry and dimensions of FIGS. 6A~6B, the channel width ($W_C$) was varied from 0 to 2 mm with a constant channel depth ($D_C$) of 0.7 mm deep, and filled with air. The simulation results are shown in TABLE 1, which illustrates the resulting temperature rise (above the ambient temperature) for both the peak temperature at the hot spot, and the global average chip temperature:

TABLE I

| Slot Width (mm) | Peak Temperature Rise (C.) | Average Temp. Rise (C.) |
|---|---|---|
| No slot (0 width) | 102.5 C. | 64 C. |
| 0.7 mm | 109.4 C. | 65.5 C. |
| 1.0 mm | 112.7 C. | 66 C. |
| 1.5 mm | 119.8 C. | 67 C. |
| 2.0 mm | 128.8 C. | 68 C. |

For a second set of computer simulations performed using the above described geometry and dimensions of FIGS. 7A~7B, it was further assumed that the channel c illustrates the resulting temperature rise (above the ambient temperature) for both the peak temperature at the hot spot, and the global average chip temperature:

TABLE II

| Slot Width (mm) | Peak Temperature Rise (C.) | Average Temp. Rise (C.) |
|---|---|---|
| No slots (0 width) | 102.5 C. | 64 C. |
| 1.0 mm slots | 103.1 C. | 67 C. |
| 2.0 mm slots | 104.1 C. | 69 C. |

It is to be noted that the simulation results in TABLE I indicate that there is a large increase in the peak temperature even when a narrow (air-filled) slot (24) (~0.7 mm in width) is aligned with the "hot spot" (40) of the chip. Furthermore, as indicted in TABLE II, when two 1.0 mm wide air-filled slots (34) were used, which were offset from the "hot spot" (40), the peak temperature is increased by less than one degree (0.6 C) compared to the no slot case. It is to be further noted that as shown in TABLE I, the peak temperature rapidly increases as the width of the air-filled slot (24) increases, and as shown in TABLE II, the average temperature increases as the width of the two air-filled slots (34) increases. The simulation results indicate that air-filled slots should not be aligned with hot spot regions of a chip, and that the slot widths should be kept to a minimum. Indeed, the experiments indicated that air-filled slots having a width of 1/32" (~0.8 mm) were effective in reducing the formation of voids. Moreover, the above results illustrate the advantage of using the time average power distribution across the chip in determining the optimum slot location.

The above experiments and thermal simulations indicated that the best performance can be achieved by using non-intersecting (i.e. parallel) slots spaced about 7.6 mm apart but which are not aligned with any chip hot spots and by making the slots about 1 mm or less in depth and about 1 mm or less in width.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for packaging an IC (integrated circuit) chip, comprising the steps of:

forming a heat conducting device having a raised structure comprising a thermal contact surface and an outer projecting portion having a height greater than that of the raised structure;

forming one or more channels in the thermal contact surface of the heat conducting device;

forming a thermal interface between the thermal contact surface of the heat conducting device and a non-active surface of an IC chip, the thermal interface comprising a layer of compliant thermally conductive material;

preventing compliant thermally conductive material from filling the one or more channels when forming the thermal interface, wherein preventing compliant thermally conductive material from filling the one or more channels when forming the thermal interface comprises:

contacting the thermal contact surface to the chip surface with compliant thermally conductive material therebetween; and obstructing the one or more channels formed in the thermal contact surface to prevent complaint thermally conductive material from filling the one or more channels when contacting the thermal contact surface to the chip surface, wherein obstructing the one or more channels comprises:

placing an object in each of the one or more channels; and removing the objects from the one or more channels after contacting the thermal contact surface to the chip surface;

the method further comprising forming one or more openings through the heat conducting device, and wherein removing the objects from the one or more channels comprises removing the objects through the one or more openings;

wherein forming a thermal interface between the thermal contact surface of the heat conducting device and a surface of an IC chip, comprises bonding the heat conducting device to a carrier substrate on which the IC chip is mounted such that the thermal contact surface and the surface of the IC chip are spaced apart at a fixed distance and in thermal contact through the compliant thermally conductive material;

further wherein forming a thermal interface between the thermal contact surface of the heat conducting device and a surface of an IC chip, comprises dispensing an excess amount of the thermally conductive compliant material onto the thermal contact surface, or onto the non-active surface of the chip mounted to the carrier substrate, and wherein bonding the heat conducting device to the carrier substrate comprises:

applying a bead of an adhesive sealant onto an bonding surface of the heat conducting device or a corresponding bonding surface of the package substrate; and contacting heat conducting device to the package substrate with a compression force to squeeze the bead of adhesive sealant and the excess thermally conductive compliant material to a desired adhesive sealant layer thickness and a thermally conductive compliant material layer thickness;

the method further comprising curing the adhesive sealant layer;

removing the objects through the one or more openings of the heat conducting device after the adhesive sealant layer is cured; and sealing the one or more openings of the heat conducting device using additional adhesive sealant.

2. The method of claim 1, wherein the objects comprise rigid rods.

3. The method of claim 1, wherein the objects comprise flexible objects.

4. The method of claim 1, wherein the objects comprise a meltable material or a dissolvable material.

5. The method of claim 4, wherein the meltable material comprises a wax material.

6. The method of claim 4, further comprising:

forming one or more openings through the heat conducting device, and wherein removing the objects from the one or more channels comprises:

melting the meltable material to enable melted material to flow out from the one or more channels through the one or more openings; or dissolving the dissolvable material to enable dissolved material to flow out from the one or more channels through the one or more openings.

7. The method of claim 4, further comprising:

forming one or more flow channels in the heat conducting device, and wherein removing the objects from the one or more channels of the thermal contact surface comprises melting the meltable material to enable melted material to flow out from the one or more channels into the one or more flow channels.

8. The method of claim 7, wherein forming one or more flow channels comprises forming at least one opening into the heat conducting device from each of the one or more channels.

9. The method of claim 1, wherein the thickness of the adhesive sealant layer is about 0.5 mils and wherein the thickness of the thermally conductive compliant material layer is about 3 mils to about 4 mils thick.

10. The method of claim 1, wherein sealing the one or more openings of the heat conducting device using additional adhesive sealant comprises applying a slight compression force to the assembly when dispensing the additional adhesive sealant to draw the additional adhesive sealant into the one or more opening when the slight compression force stopped.

11. The method of claim 1, wherein the one or more channels are formed in the thermal contact surface of a heat conducting device such that the one or more channels are not aligned with a hot spot region of the IC chip.

12. A method for packaging an IC (integrated circuit) chip, comprising the steps of:

forming one or more channels in a thermal contact surface of a heat conducting device;

filling the one or more channels with a flexible object;

forming a thermal interface between the thermal contact surface of the heat conducting device and a non-active surface of an IC chip, the thermal interface comprising a layer of compliant thermally conductive material, wherein the flexible object prevents the compliant thermally conductive material from filling the one or more channels when forming the thermal interface;

curing the compliant thermally conductive material; and removing the flexible object through the one or more openings of the heat conducting device after the compliant thermally conductive material is cured; and sealing the one or more openings of the heat conducting device using additional adhesive sealant.

13. A method for packaging an IC (integrated circuit) chip, comprising the steps of:

forming one or more channels in a thermal contact surface of a heat conducting device;

filling the one or more channels with respective one or more rigid rods;

forming a thermal interface between the thermal contact surface of the heat conducting device and a non-active surface of an IC chip, the thermal interface comprising a layer of compliant thermally conductive material, wherein the one or more rigid rods prevent the compliant thermally conductive material from filling the one or more channels when forming the thermal interface;

curing the compliant thermally conductive material; and removing the one or more rigid rods through the one or more openings of the heat conducting device after the compliant thermally conductive material is cured; and sealing the one or more openings of the heat conducting device using additional adhesive sealant.

* * * * *